US010617203B2

(12) United States Patent
Tao

(10) Patent No.: US 10,617,203 B2
(45) Date of Patent: Apr. 14, 2020

(54) MODULAR CABINET AND CONNECTOR MODULE THEREOF

(71) Applicant: Dongan Electric Manufacturing Company, Philadelphia, PA (US)

(72) Inventor: Hai Tao, Philadelphia, PA (US)

(73) Assignee: DONGAN ELECTRIC MANUFACTURING COMPANY, Philadelphia, PA (US)

(*) Notice: Subject to any disclaimer, the term of this patent is extended or adjusted under 35 U.S.C. 154(b) by 0 days.

(21) Appl. No.: 16/164,534

(22) Filed: Oct. 18, 2018

(65) Prior Publication Data

US 2019/0116972 A1  Apr. 25, 2019

(30) Foreign Application Priority Data

Oct. 20, 2017 (CN) .......................... 2017 1 0982631
Nov. 6, 2017 (CN) .......................... 2017 1 1077710

(51) Int. Cl.
| *A47B 47/00* | (2006.01) |
| *A47B 47/03* | (2006.01) |
| *F16B 12/50* | (2006.01) |
| *H05K 7/14* | (2006.01) |
| *F16B 12/44* | (2006.01) |

(52) U.S. Cl.
CPC ........ *A47B 47/005* (2013.01); *A47B 47/0008* (2013.01); *A47B 47/03* (2013.01); *F16B 12/50* (2013.01); *H05K 7/1488* (2013.01); *F16B 2012/446* (2013.01)

(58) Field of Classification Search
CPC ............ A47B 47/0008; A47B 47/0016; A47B 47/0033; A47B 47/005; A47B 47/0091; A47B 47/03; F16B 12/50; F16B 2012/446; H05K 7/1488; H02B 1/28
See application file for complete search history.

(56) References Cited

U.S. PATENT DOCUMENTS

| 2,058,263 | A | * | 10/1936 | Rosendale | ............... | H02B 1/30 |
| | | | | | | 312/265.4 |
| 6,102,498 | A | * | 8/2000 | Kohler | ..................... | H02B 1/28 |
| | | | | | | 312/223.1 |
| 6,270,283 | B1 | * | 8/2001 | Turati | ..................... | H02B 1/01 |
| | | | | | | 403/174 |

(Continued)

FOREIGN PATENT DOCUMENTS

WO   WO-2011050492 A1 *  5/2011  .......... A47B 47/0016

*Primary Examiner* — Andrew M Roersma
(74) *Attorney, Agent, or Firm* — Hamre, Schumann, Mueller & Larson, P.C.

(57) ABSTRACT

A cabinet includes a structural frame including a plurality of connecting rods and a plurality of connector modules each of which includes first and second connectors. The first connector includes two first main plate portions perpendicularly connected to each other, a first fastening hole, and a limiting indented portion. The second connector includes a second main plate portion perpendicular to the first main plate portions, a seat body connected to the second main plate portion and having a first fastening hole corresponding in position to the first fastening hole of the first connector, and a limiting protruding portion protruding from the second main plate portion and having a shape complementing with that of the limiting indented portion.

13 Claims, 10 Drawing Sheets

(56) References Cited

U.S. PATENT DOCUMENTS

| | | | | |
|---|---|---|---|---|
| 6,471,434 B2 * | 10/2002 | Chin | ............... | A47B 13/06 |
| | | | | 312/140 |
| 8,091,970 B2 * | 1/2012 | Francisquini | ......... | H02B 1/301 |
| | | | | 211/192 |
| 8,196,758 B2 * | 6/2012 | Lee | ............ | A47B 47/03 |
| | | | | 211/26 |
| 8,292,380 B2 * | 10/2012 | Fan | ............ | H05K 7/183 |
| | | | | 312/265.4 |
| 9,371,849 B2 * | 6/2016 | Schaaf | ............ | F16B 7/0446 |
| 2013/0069501 A1 * | 3/2013 | Liu | ............ | H05K 7/18 |
| | | | | 312/223.1 |
| 2018/0116400 A1 * | 5/2018 | Lu | ............ | H05K 7/1488 |

\* cited by examiner

MODULAR CABINET AND CONNECTOR MODULE THEREOF

CROSS-REFERENCE TO RELATED APPLICATION

This application claims priority to Chinese Patent Application Nos. 201710982631.1 and 201711077710.4, filed on Oct. 20, 2017 and Nov. 6, 2017, respectively.

FIELD

The disclosure relates to a cabinet, more particularly to a modular cabinet and a connector module thereof.

BACKGROUND

Generally, in the fields of industrial control, IT communication, power transmission and distribution systems, a frame-type cabinet is usually used for accommodating an electronic device for easy management and installation. Since the cabinet is bulky, it is not easy to transport. An existing modular cabinet includes a structural frame, and a plurality of wall panels assembled to the structural frame to form a closed accommodating space. Generally, the structural frame includes a plurality of connecting rods and a plurality of connectors assembled to form a rectangular columnar shape. That is, the number of the connecting rods is usually twelve to form a rectangular columnar edge, and the number of the connectors is usually eight located at the corners of the rectangular column for inter-connecting the connecting rods. Through the modular configuration of the structural frame, the overall volume of the modular cabinet can be reduced so that transport of the latter is convenient.

However, since the electronic device installed in the cabinet is usually heavy, if the connecting force between the components of the structural frame is insufficient, or if the fasteners used for connection generate torques causing the connecting rods to skew, the connecting rods cannot be horizontally or perpendicularly maintained, thereby causing the structure of the structural frame to be unstable, even to the point of not being to complete the assembly due to skewing of some of the connecting rods.

SUMMARY

Therefore, an object of the present disclosure is to provide a cabinet that is capable of alleviating at least one of the drawbacks of the prior art.

Another object of this disclosure is to provide a connector module that can prevent skewing of connecting rods.

According to one aspect of this disclosure, a cabinet includes a structural frame, and an outer wall unit including a plurality of wall panels assembled to the structural frame and cooperating with the same to form an accommodating space. The structural frame has a rectangular columnar shape and includes a plurality of connecting rods and a plurality of connector modules. Each connecting rod has two opposite connecting end portions. The connector modules interconnect the connecting rods and are respectively disposed at corners of the structural frame. Each connector module includes a first connector and a second connector. The first connector includes two first main plate portions perpendicularly connected to each other. Each first main plate portion has an inner surface, an outer surface opposite to the inner surface, a first edge surface between first edges of the inner and outer surfaces, and a second edge surface between second edges of the inner and outer surfaces and perpendicularly connected to the first edge surface. The first connector further includes two connecting plate portions each of which is formed on the outer surface of a respective first main plate portion for connection with the connecting end portion of one of the connecting rods, a first fastening hole extending through a junction of the second edge surfaces of the first main plate portions, and a limiting indented portion located on the junction of the second edge surfaces of the first main plate portions and adjacent to the first edge surfaces of the first main plate portions. The inner surfaces of the first main plate portions cooperatively define an assembling space therebetween. The second connector is detachably connected to the first connector and includes a second main plate portion perpendicular to the first main plate portions and abutting against the first edge surfaces of the first main plate portions, a seat body that is connected to a side of the second main plate portion, that is received in the assembling space, and that abuts against the first main plate portions, and a connecting plate portion formed on another side of the second main plate portion opposite to the seat body for connection with one of the connecting end portions of one of the connecting rods. The second main plate portion has a first edge surface and a second edge surface perpendicularly connected to each other and respectively corresponding to the first edge surfaces of the first main plate portion. The seat body has a first fastening hole extending therethrough and corresponding in position to the first fastening hole of the first connector. The first fastening holes of the seat body and the first connector are configured to cooperatively receive and engage a fastening member to fasten together the first and second connectors. The second connector further includes a limiting protruding portion that protrudes from the second main plate portion, that is adjacent to the first and second edge surfaces of the second main plate portion, and that has a shape complementing with that of the limiting indented portion to abut against the limiting indented portion.

According to another aspect of this disclosure, a connector module is configured for connecting three connecting rods such that the connecting rods are perpendicular to one another. The connector module includes a first connector and a second connector. The first connector includes two first main plate portions, two connecting plate portions, a first fastening hole, and a limiting indented portion. The first main plate portions are perpendicularly connected to each other. Each first main plate portion has an inner surface, an outer surface opposite to the inner surface, a first edge surface between first edges of the inner and outer surfaces, and a second edge surface between second edges of the inner and outer surfaces and perpendicularly connected to the first edge surface. The inner surfaces of the first main plate portions cooperatively define an assembling space therebetween. Each connecting plate portion is formed on the outer surface of a respective first main plate portion for connection with one of the connecting rods. The first fastening hole extends through a junction of the second edge surfaces of the first main plate portions. The limiting indented portion is located on the junction of the second edge surfaces of the first main plate portions and is adjacent to the first edge surfaces of the first main plate portions.

The second connector is detachably connected to the first connector, and includes a second main plate portion, a seat body, a connecting plate portion, and a limiting protruding portion. The second main plate portion is perpendicular to the first main plate portions, and abuts against the first edge surfaces of the first main plate portions. The second main plate portion has a first edge surface and a second edge surface perpendicularly connected to each other and respectively corresponding to the first edge surfaces of the first main plate portion. The first and second edge surfaces of the second main plate portion respectively correspond to the first edge surfaces of the first main plate portion. The seat body is connected to a side of the second main plate portion, is received in the assembling space, and abuts against the first main plate portions. The seat body has a first fastening hole extending therethrough and corresponding in position to the first fastening hole of the first connector. The first fastening holes of the seat body and the first connector are configured to cooperatively receive and engage a fastening member to fasten together the first and second connectors. The connecting plate portion is formed on another side of the second main plate portion opposite to the seat body for connection with one of the connecting rods. The limiting protruding portion protrudes from the second main plate portion, is adjacent to the first and second edge surfaces of the second main plate portion, and has a shape complementing with that of the limiting indented portion to abut against the limiting indented portion.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
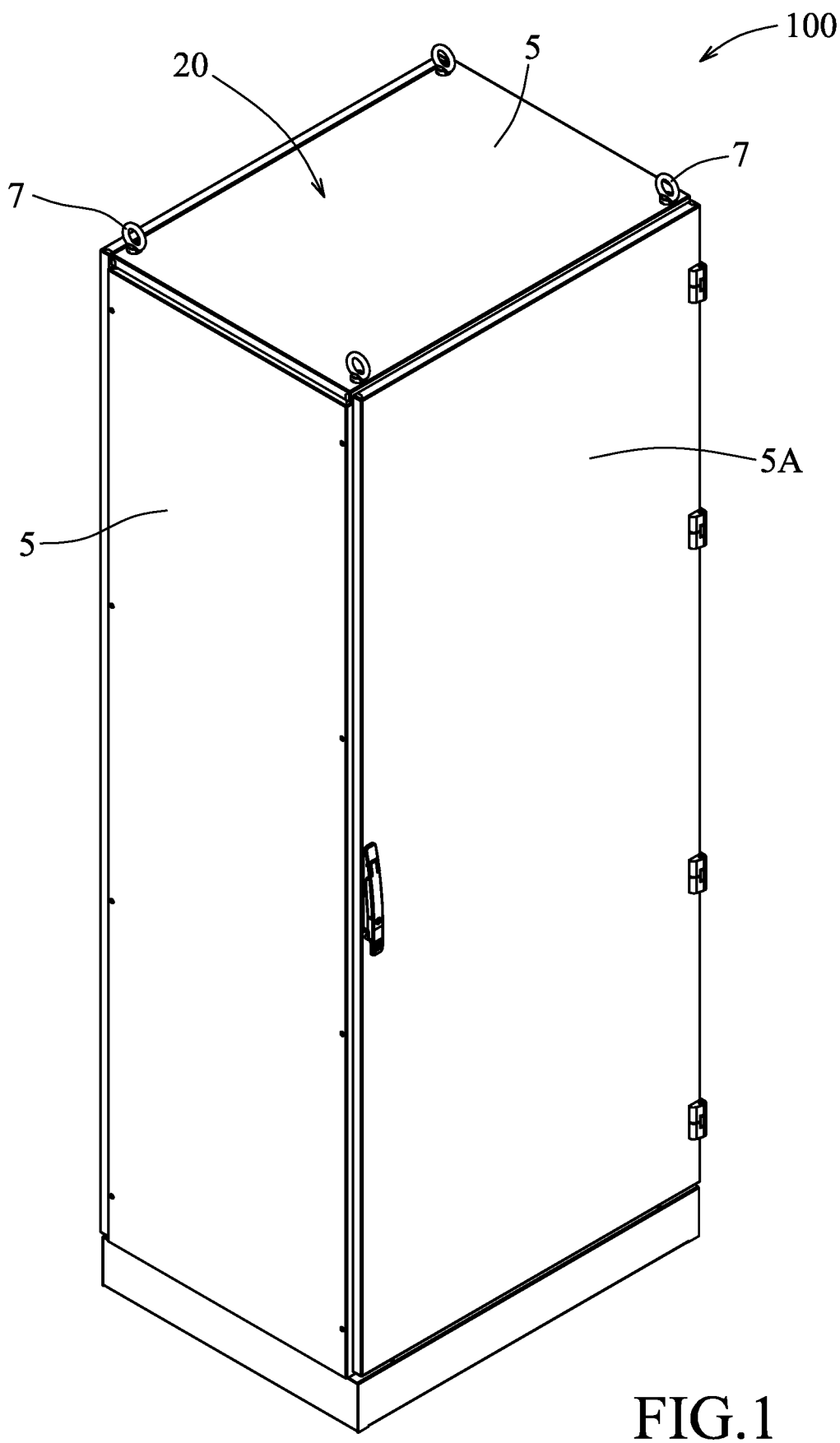
FIG. 1 is a perspective view of a cabinet according to the first embodiment of this disclosure.

Before the present disclosure is described in greater detail with reference to the accompanying embodiments, it should be noted herein that like elements are denoted by the same reference numerals throughout the disclosure.

Referring to FIGS. 1 to 5, a cabinet 100 according to the first embodiment of the present disclosure is shown to include a structural frame 10 and an outer wall unit 20. The structural frame 10 has a rectangular columnar shape, and includes a plurality of connecting rods 1, and a plurality of connector modules 2 inter-connecting the connecting rods 1 and respectively disposed at corners of the structural frame 10. That is, each connector module 2 is used to connect three connecting rods 1 such that the connecting rods 1 are perpendicular to each other. The outer wall unit 20 includes a plurality of wall panels 5 assembled to the structural frame 10 and cooperating with the same to form an accommodating space 30. One of the wall panels 5 serves as a door panel (5A) of the cabinet 100 and is pivotable between a closed position and an open position.

Each connecting rod 1 has two opposite connecting end portions 11, and includes two inner plate bodies 12 and an outer plate body 13 connected to each other such that the connecting rod 1 has a triangular columnar shape. Specifically, the cross section of each connecting rod 1 is an isosceles right triangle. The two inner plate bodies 12 correspond to two legs of the isosceles right triangle, while the outer plate body 13 corresponds to a hypotenuse thereof. The inner plate bodies 12 are perpendicularly connected to each other, and face the accommodating space 30. Each inner plate body 12 is formed with a plurality of mounting holes 121 spaced apart from each other along the length thereof for mounting of partition plates (not shown). The outer plate body 13 is located outside of the accommodating space 30, and has an outer surface formed with at least one liquid guide groove 131 extending from one of the connecting end portions 11 to the other connecting end portion 11. In this embodiment, each connecting rod 1 is formed by bending, welding and fixing a metal plate, and the outer surface of the outer plate body 13 of each connecting rod 1 is formed with two liquid guide grooves 131 that are symmetrical to each other. Further, the liquid guide grooves 131 of the connecting rods 1 connected to the same connector module 2 communicate with one another. When the cabinet 100 gets wet due to the rain or water or other liquid, the liquid will first enter the liquid guide grooves 131 of the connecting rods 1 horizontally disposed on a top side of the cabinet 100, and will then be guided by the horizontally disposed liquid guide grooves 131 to flow through the liquid guide grooves 131 of the vertically disposed connecting rods and discharge to the ground, thereby preventing accumulation of the liquid at the top side of the cabinet 100 and preventing the liquid to enter the accommodating space 30 when the door panel (5A) (see FIG. 1) is opened.

Figure 5:
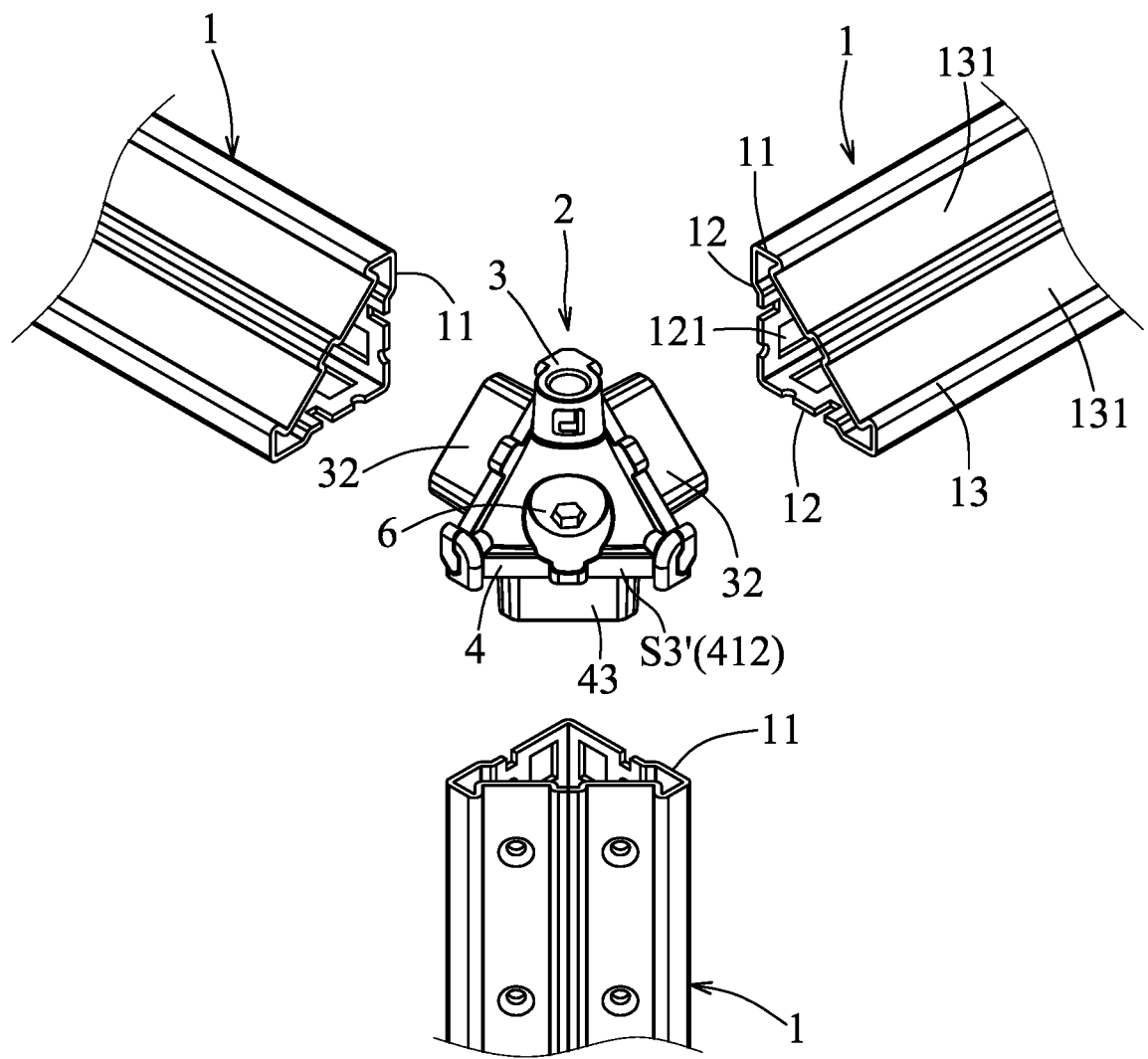
FIG. 5 is an exploded perspective view of FIG. 4.
Figure 6:
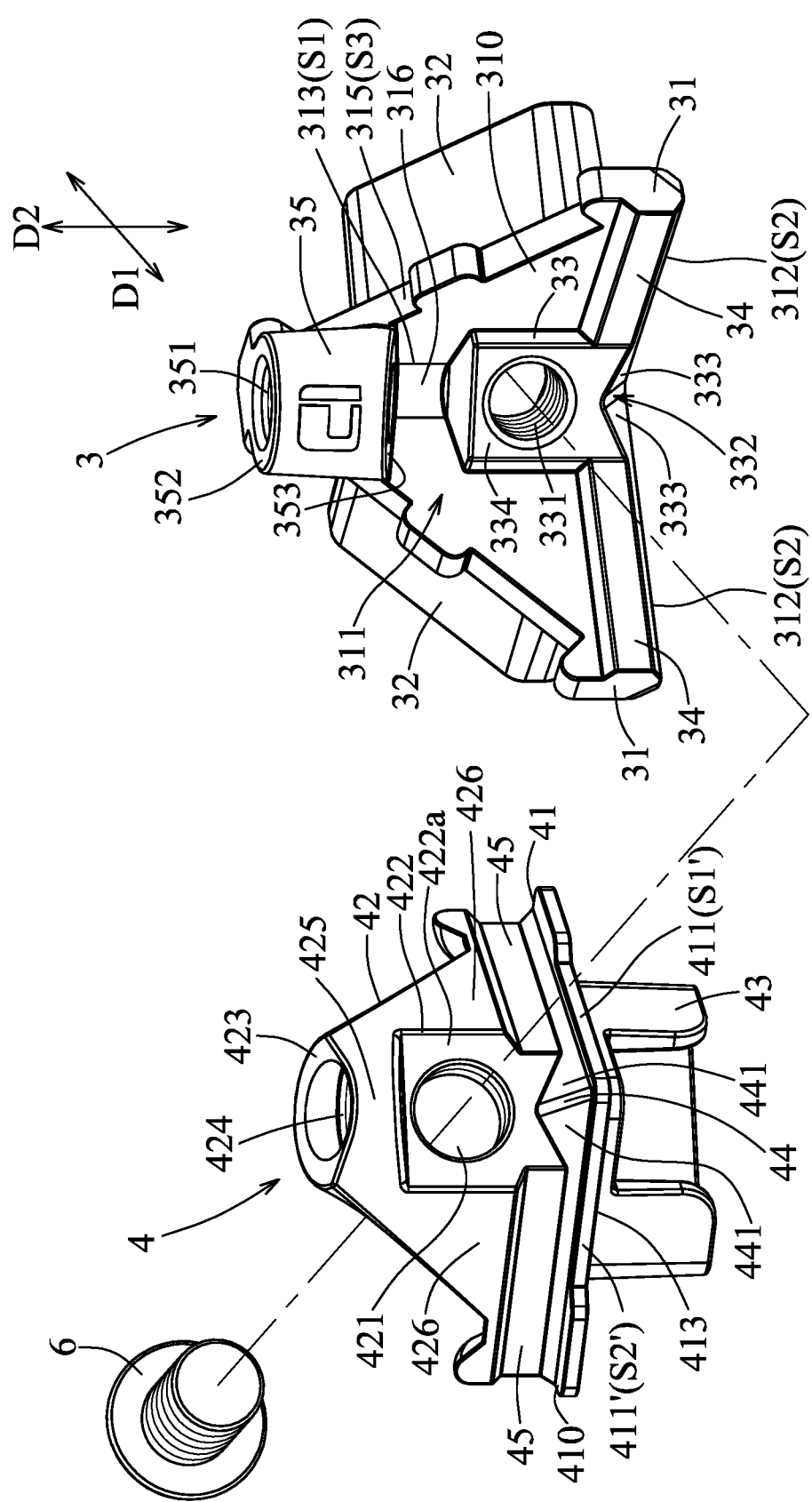
FIG. 6 is an exploded perspective view of a connector module of the first embodiment.
Figure 7:
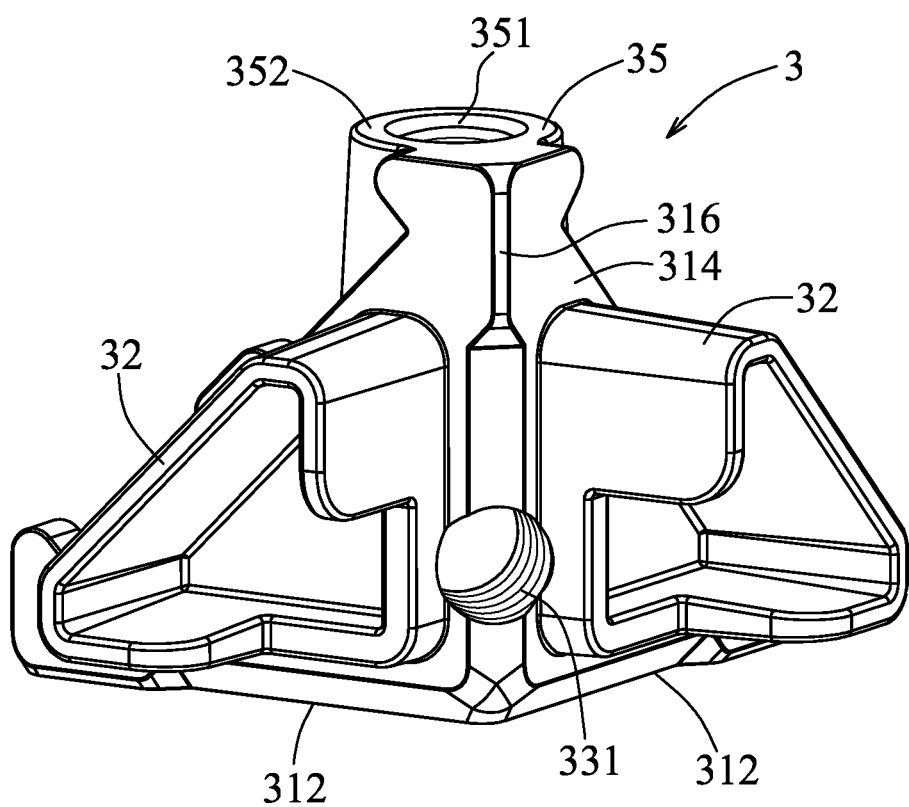
FIG. 7 is a perspective view of a first connector of the connector module.

Referring to FIGS. 6 and 7, in combination with FIG. 5, each connector module 2 includes a first connector 3 and a second connector 4. The first connector 3 includes two first main plate portions 31, two connecting plate portions 32, a first block body 33, a first fastening hole 331, a limiting indented portion 332, two protruding bars 34, and a second block body 35.

The first main plate portions 31 are perpendicularly connected to each other. Each first main plate portion 31 has an inner surface 310, an outer surface 314 opposite to the inner surface 310, a first edge surface 312 between first edges of the inner and outer surfaces 310, 314, a second edge surface 313 between second edges of the inner and outer surfaces 310, 314 and perpendicularly connected to the first edge surface 312, and a third edge surface 315 between third edges of the inner and outer surfaces 310, 314 and connected between the first and second edge surfaces 312, 313. The inner surfaces 310 of the first main plate portions 31 cooperatively define an assembling space 311 therebetween. The first edge surfaces 312 of the first main plate portions 31 are perpendicular to each other and are coplanar. The second edge surfaces 313 of the first main plate portions 31 are joined to form a junction 316. The third edge surface 315 has a contour corresponding to that of the outer surface of the outer plate body 13. In this embodiment, each first main plate portion 31 has a shape matching the cross-sectional shape of the connecting rod 1, which is an isosceles right triangle. The second edge surface 313 of the first main plate portion 31 corresponds to a leg (S1) of the isosceles right triangle, the first edge surface 312 thereof corresponds to the other leg (S2) of the isosceles right triangle, and the third edge surface 315 thereof corresponds to a hypotenuse (S3) thereof.

Each connecting plate portion 32 is formed on the outer surface 314 of a respective one of the first main plate portions 31 for connection with the connecting end portion 11 of one of the connecting rods 1.

Figure 4:
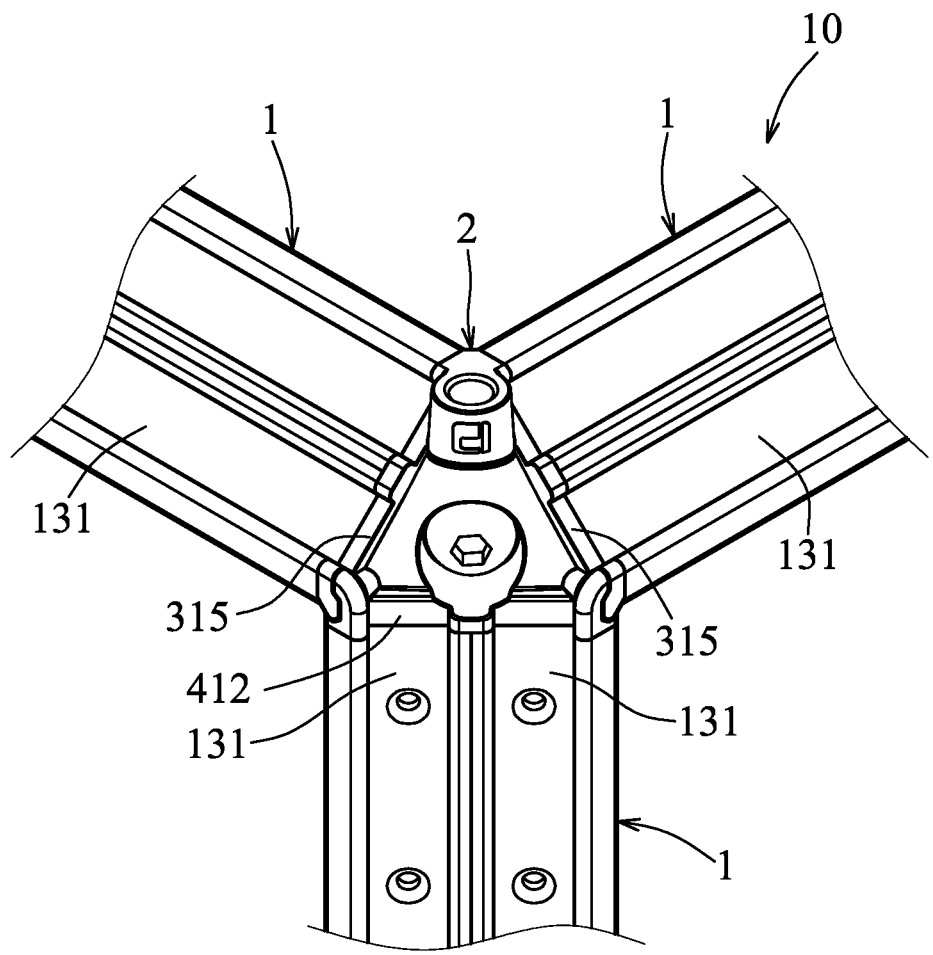
FIG. 4 is an enlarged fragmentary perspective view of a corner of a structural frame of the first embodiment.

When each connecting plate portion 32 is connected to the connecting end portion 11 of one of the connecting rods 1, the third edge surface 315 of each first main plate portion 31 is flush with the outer plate body 13, and forms a continuous surface with the outer surface of the outer plate body 13 (see FIG. 4). Through this, the liquid guide grooves 131 of each connecting rod 1 can extend to the corresponding connector module 2.

The first block body 33 is connected to the junction 316, and protrudes into the assembling space 311. The first block body 33 has a first abutment surface 334 opposite to the junction 316. The first fastening hole 331 extends through the first block body 33 and the junction 316 in a first direction (D1) perpendicular to the junction 316. The limiting indented portion 332 is formed on a side of the first block body 33 that is below the first fastening hole 331 and that is adjacent to the first edge surfaces 312 of the first main plate portions 31, and extends toward the junction 316. The side of the first block body 33 has two triangular inclined surfaces 333 extending inclinedly, inwardly, upwardly and respectively from the first edge surfaces 312 toward each other so as to connect with each other and to cooperatively define the limiting indented portion 332.

The protruding bars 34 respectively protrude from the inner surfaces 310 of the first main plate portions 31 toward the assembling space 311, and are respectively adjacent to the first edge surfaces 312. In this embodiment, the protruding bars 34 extend from two opposite sides of the first block body 33 toward the third edge surfaces 315 of the corresponding first main plate portions 31. The first abutment surface 332 of the first block body 33 is located between the protruding bars 34.

The second block body 35 is connected to the junction 316, is located above the first block body 33, and is spaced apart from the first block body 33 in a second direction (D2) parallel to the junction 316. The second block body 35 has a second fastening hole 351 extending therethrough in the second direction (D2). Specifically, the second block body 35 has an outer end surface 352 and an inclined abutment surface 353 opposite to each other in the second direction (D2), and the second fastening hole 351 extends through the outer end surface 352 and the inclined abutment surface 353.

The second connector 4 is detachably connected to the first connector 3, and includes a second main plate portion 41, a seat body 42, a connecting plate portion 43, a limiting protruding portion 44, and two limiting grooves 45. The second main plate portion 41 is perpendicular to the first main plate portions 31, and abuts against the first edge surfaces 312 of the first main plate portions 31. The second main plate portion 41 has opposite inner and outer surfaces 410, 413, a first edge surface 411 between first edges of the inner and outer surfaces 410, 413, a second edge surface 411' between second edges of the inner and outer surfaces 410, 413 and perpendicularly connected to the first edge surface 411, and a third edge surface 412 between third edges of the inner and outer surfaces 410, 413 and connected between the first and second edge surfaces 411, 411'. The first and second edge surfaces 411, 411' respectively correspond to the first edge surfaces 312 of the first main plate portions 31. In this embodiment, the second main plate portion 41 also has the shape of an isosceles right triangle. The first and second edge surfaces 411, 411' respectively correspond to two legs (S1', S2') of the isosceles right triangle, while and the third edge surface 412 corresponds to a hypotenuse (S3') of the isosceles right triangle. The third edge surface 412 also has a contour corresponding to that of the outer surface of the outer plate body 13.

The connecting plate portion 43 is formed on the outer surface 413 of the second main plate portion 41 for connection with the connecting end portion 11 of one of the connecting rods 1.

Similarly, when the connecting plate portion 43 is connected to the connecting end portion 11 of one of the connecting rods 1, the third edge surface 412 of the second main plate portion 41 is flush with the outer plate body 13, and forms a continuous surface with the outer surface of the outer plate body 13 (see FIG. 4). Through this, the liquid guide grooves 131 of each connecting rod 1 can extend to the corresponding connector module 2. Further, two horizontal connecting rods 1 and a vertical connecting rod 1, which are connected to the same connector module 2, have their liquid guide grooves 131 communicating with one another.

The seat body 42 is connected to the inner surface 410 of the second main plate portion 41, and is opposite to the connecting plate portion 43. Further, the seat body 42 is received in the assembling space 311, and has a first fastening hole 421, a receiving portion 422, an end surface 423, a second fastening hole 424, an engaging portion 425, and two inner side surfaces 426. The first fastening hole 421 extends through the seat body 42, and corresponds in position to the first fastening hole 331. The first fastening hole 421 and the first fastening hole 331 cooperatively receive and engage a fastening member 6 to fasten together the first and second connectors 3, 4. The receiving portion 422 complements with and receives the first block body 33, and has a second abutment surface (422a) abutting against the first abutment surface 334. The first fastening hole 421 perpendicularly extends through the second abutment surface (422a).

The end surface 423 is inclined, and matches with the inclined abutment surface 353 of the second block body 35. The second fastening hole 424 extends inwardly from the end surface 423, and corresponds in position to the second fastening hole 351. The second fastening hole 351 of the second block body 35 and the second fastening hole 424 of the seat body 42 are configured to cooperatively receive and engage an eye bolt 7 (see FIGS. 1 to 3). The eye bolt 7 is provided according to the requirement, but may be dispensed accordingly. The engaging portion 425 is located between the end surface 423 and receiving portion 422, and is engaged between the first and second block bodies 33, 35. The inner side surfaces 426 are perpendicular to each other and respectively abut against the first main plate portions 31. The receiving portion 422 is located between the inner side surfaces 426.

The limiting protruding portion 44 protrudes inwardly from the second main plate portion 41, is located between the first and second edge surfaces 411, 411', and is adjacent to the second abutment surface (422a). The limiting protruding portion 44 has a shape complementing with that of the limiting indented portion 332 to abut against the same. That is, the limiting protruding portion 44 has two triangular inclined surfaces 441 respectively abutting against the triangular inclined surfaces 333 of the limiting indented portion 332.

Each of the limiting grooves 45 is cooperatively defined by the top surface 410 of the second main plate portion 41 and a corresponding one of the side surfaces 426 of the seat body 42. The limiting grooves 45 respectively receive and engage the protruding bars 34.

Figure 2:
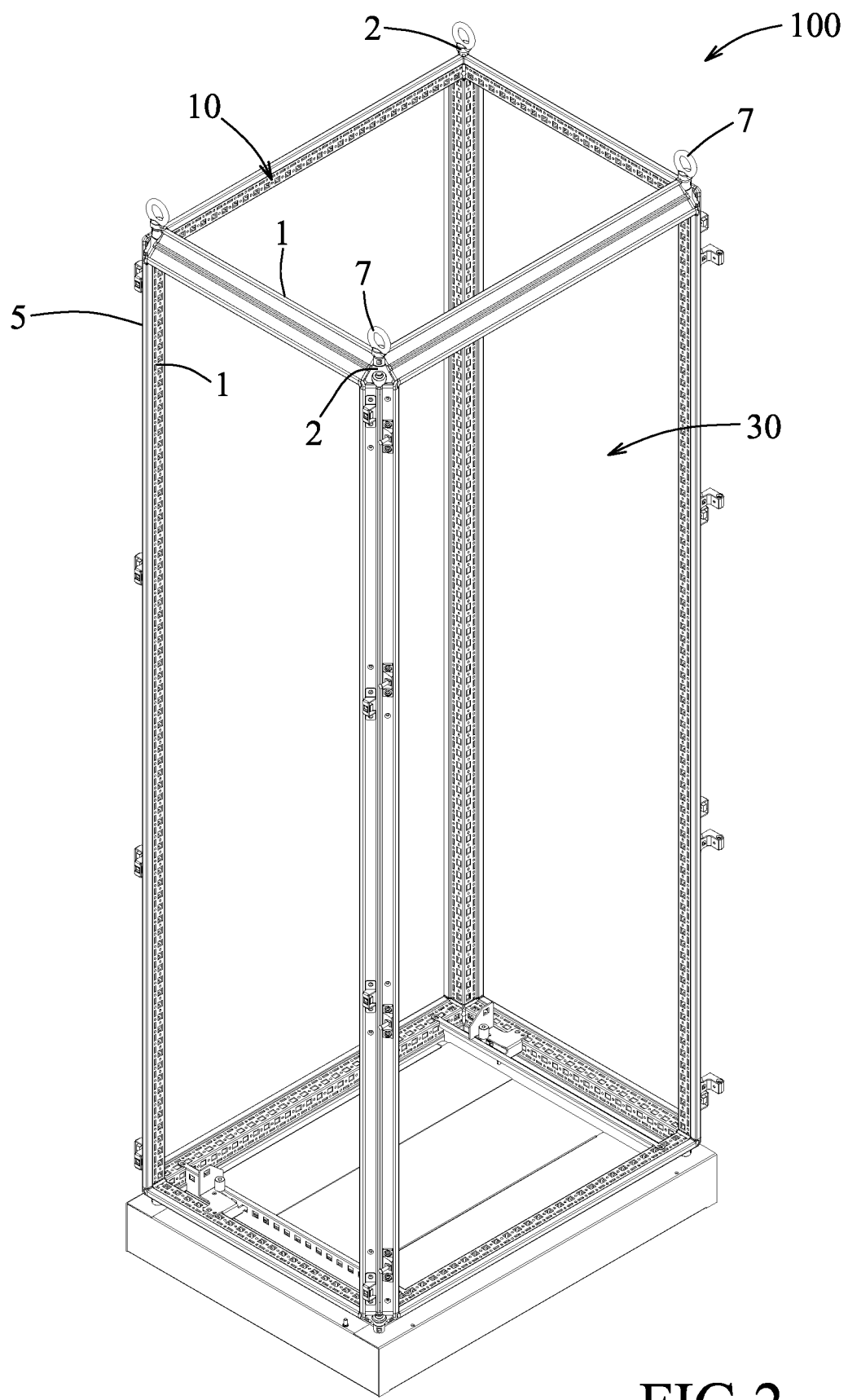
FIG. 2 is a view similar to FIG. 1, but with some of wall panels of an outer wall unit being removed.
Figure 3:
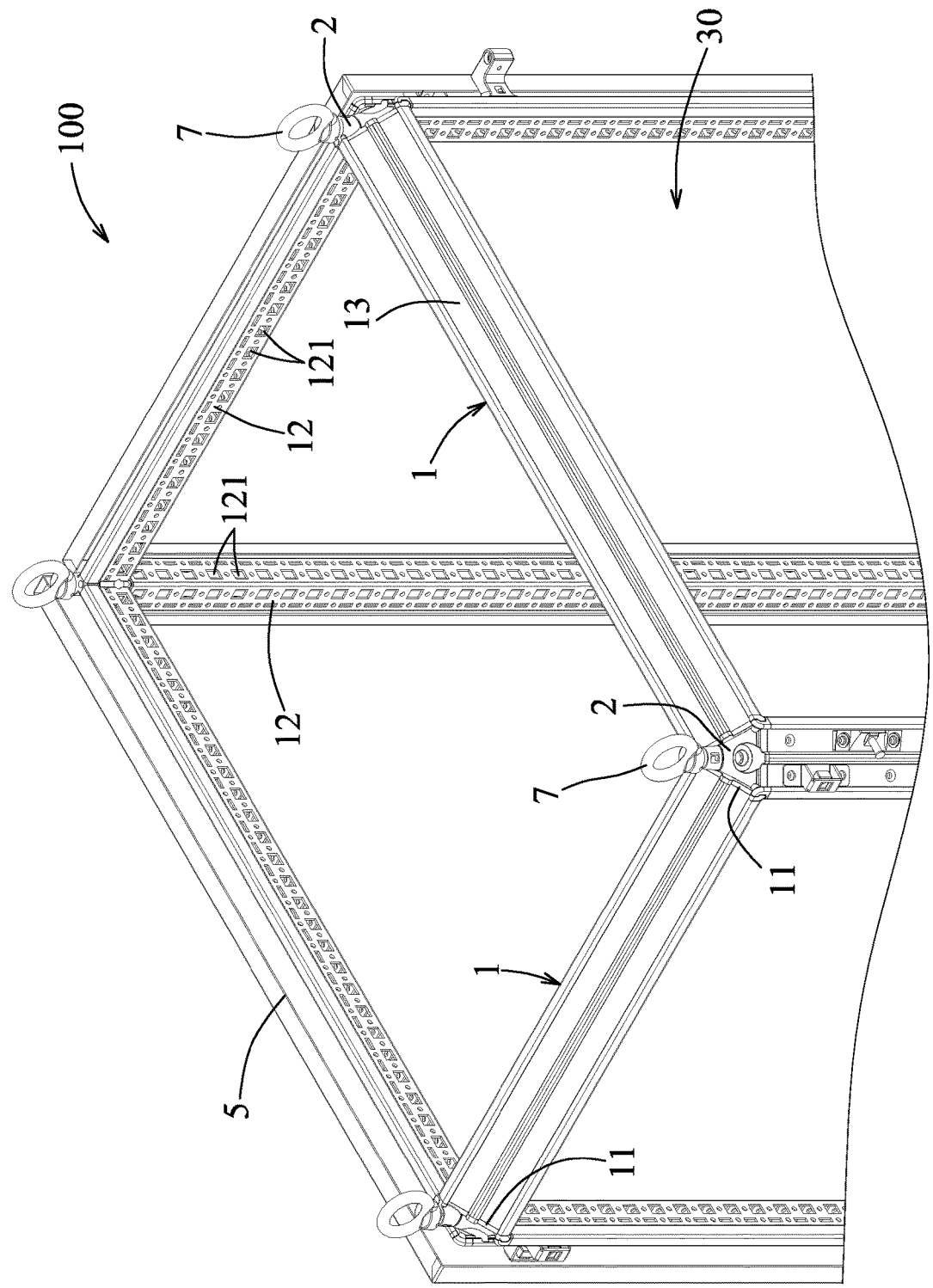
FIG. 3 is an enlarged fragmentary perspective view of FIG. 2.

In this embodiment, the connector modules 2 disposed at four corners of the cabinet 100 are each provided with the eye bolt 7, as shown in FIGS. 1 to 3, to facilitate hanging and transport of the cabinet 100.

Figure 8:
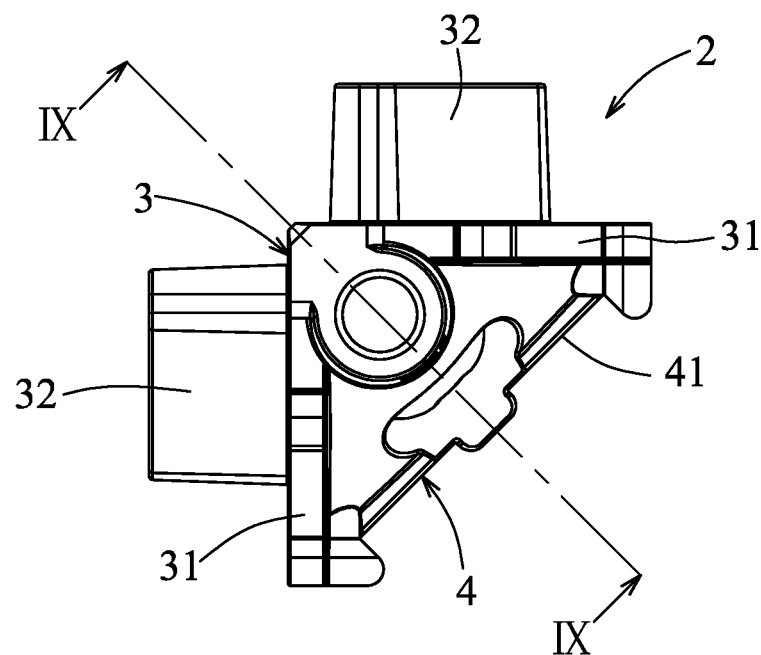
FIG. 8 is a top view of the connector module in an assembled state.
Figure 9:
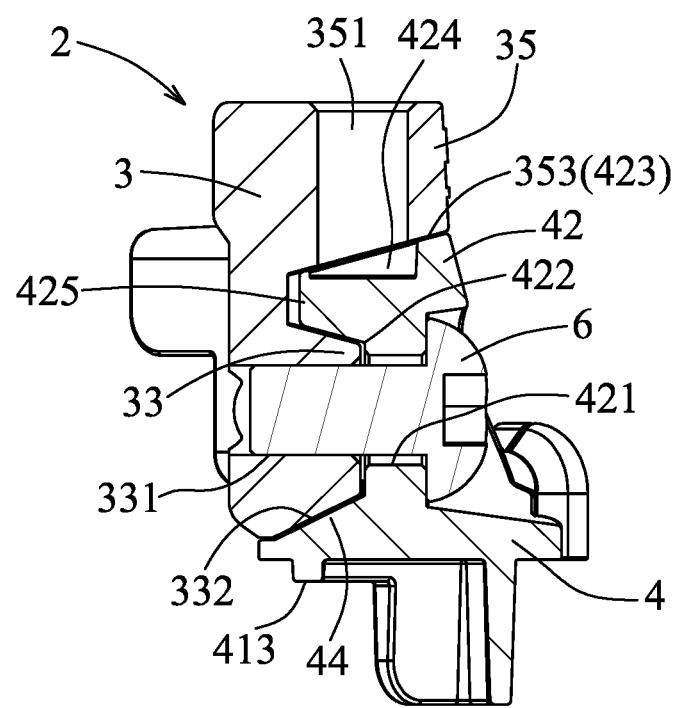
FIG. 9 is a sectional view taken along line IX-IX of FIG. 8.
Figure 10:
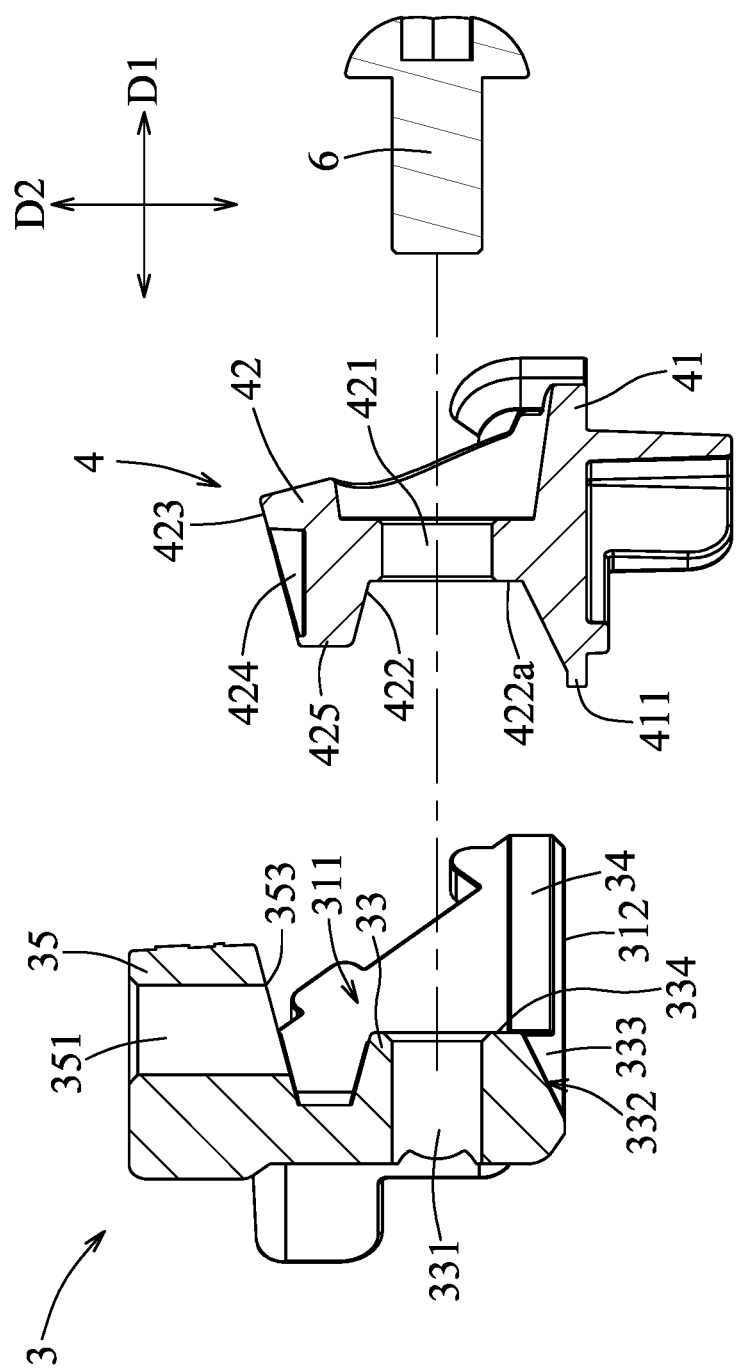
FIG. 10 is an exploded sectional view of FIG. 9.

Referring to FIGS. 8 to 10, in combination with FIG. 6, when the second connector 4 is assembled to the first connector 3, the receiving portion 422 receives the first block body 33, the end surface 423 abuts against the inclined abutment surface 353 of the second block body 35, and the engaging portion 425 of the seat body 42 is engaged between the first and second block bodies 33, 35. The limiting protruding portion 44 is engaged to the limiting indented portion 332 with the two triangular inclined surfaces 441 thereof respectively abutting against the triangular inclined surfaces 333 of the limiting indented portion 332. The limiting grooves 45 respectively receive the protruding bars 34. In other words, the structures of the first and second connectors 3, 4 interact with each other in the assembling space 311, so that the first and second connectors 3, 4 will not slide and rotate relative to each other, thereby providing a good structural strength and reliability. Particularly, the limiting indented portion 332 and the limiting protruding portion 44 abut against each other in a triangular pyramid-like structure which can indeed prevent the relative position of the first and second connectors 3, 4 to produce a torsional deviation when a force is applied during rotation of the fastening member 6 by a user, so that perpendicular connection of the connecting rods 1 with the same connector module 2 can be ensured. That is, the three connecting rods 1 connected to the same connector module 2 are assured to be located on three axes of a three-dimensional coordinate system. As such, it is convenient to connect the connecting rods 1 when assembling the structural frame 10, and the situation in which some of the connecting rods 1 may be skewed and may not be connected can be avoided. Thus, the structural frame 10, after assembly, is not skewed.

Figure 11:
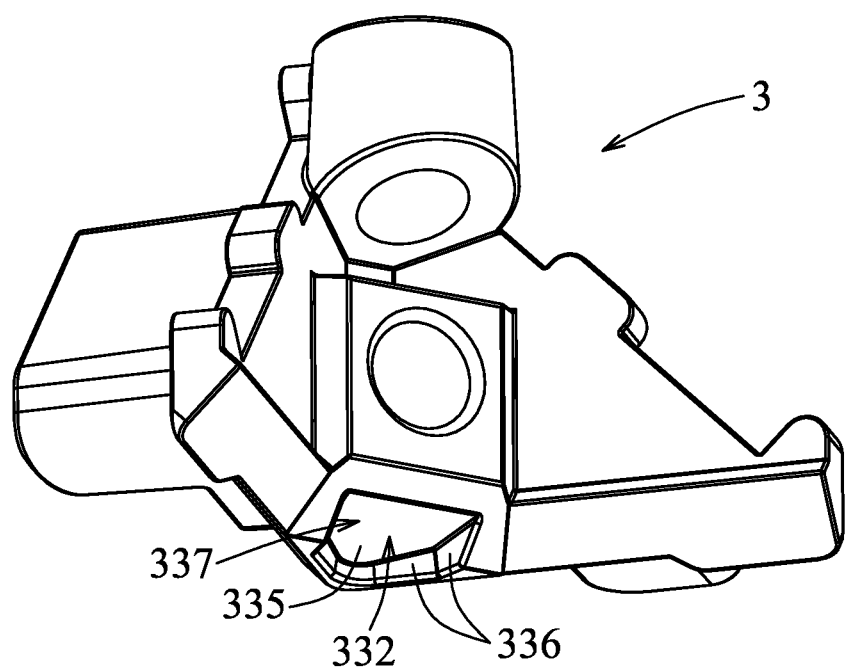
FIG. 11 is a perspective view of a first connector of a connector module of a cabinet according to the second embodiment of this disclosure.
Figure 12:
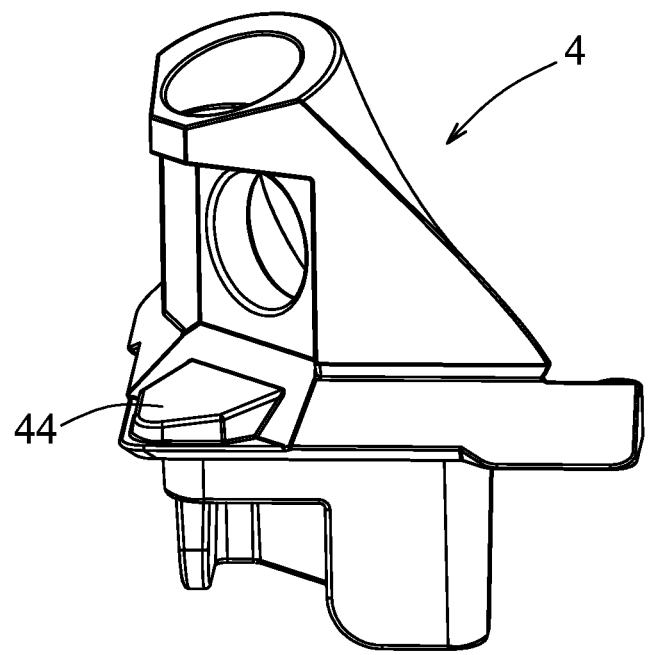
FIG. 12 is a perspective view of a second connector of the connector module of the second embodiment.

Referring to FIGS. 11 and 12, the second embodiment of the cabinet 100 of this disclosure is generally identical to the first embodiment, and differs in that, in the second embodiment, the limiting indented portion 332 of the first connector 3 has a base surface 335, and a plurality of side surfaces 336 connected to and surrounding a periphery of the base surface 335 and cooperating with the base surface 335 to define a space 337 for receiving the limiting protruding portion 44. Further, the limiting protruding portion 44 of the second connector 4 corresponds to a polygonal shape of the limiting indented portion 332, particularly, a pentagonal shape. Similarly, through the complementary structure of the limiting indented portion 332 and the limiting protruding portion 44, they can mutually engage and limit each other.

In sum, through the complementary engaging structures of the first and second connectors 3, 4 of each connector module 2, the first and second connectors 3, 4 will not slide and rotate relative to each other, so that the structural frame 10 can indeed form a rectangular columnar frame and has a good structural strength and reliability.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A cabinet comprising:
a structural frame having a rectangular columnar shape and including
a plurality of connecting rods, each of which has two opposite connecting end portions, and
a plurality of connector modules interconnecting said connecting rods and respectively disposed at corners of said structural frame, each of said connector modules including
a first connector including two first main plate portions perpendicularly connected to each other, each of said first main plate portions having an inner surface, an outer surface opposite to said inner surface, a first edge surface between first edges of said inner and outer surfaces, and a second edge surface between second edges of said inner and outer surfaces and perpendicularly connected to said first edge surface, said first connector further including two connecting plate portions each of which is formed on said outer surface of a respective one of said first main plate portions for connection with said connecting end portion of one of said connecting rods, a first fastening hole extending through a junction of said second edge surfaces of said first main plate portions, and a limiting indented portion located on said junction of said second edge surfaces of said first main plate portions and adjacent to said first edge surfaces of said first main plate portions, said inner surfaces of said first main plate portions cooperatively defining an assembling space therebetween, and
a second connector detachably connected to said first connector and including a second main plate portion perpendicular to said first main plate portions and abutting against said first edge surfaces of said first main plate portions, a seat body that is connected to a side of said second main plate portion, that is received in said assembling space, and that abuts against said first main plate portions, and a connecting plate portion formed on another side of said second main plate portion opposite to said seat body for connection with one of said connecting end portions of one of said connecting rods, said second main plate portion having a first edge surface and a second edge surface perpendicularly connected to each other and respectively corresponding to said first edge surfaces of said first main plate portion, said seat body having a first fastening hole extending therethrough and corresponding in position to said first fastening hole of said first connector, said first fastening holes of said seat body and said first connector being configured to cooperatively receive and engage a fastening member to fasten together said first and second connectors, said second connector further including a limiting protruding portion that protrudes inwardly from said second main plate portion, that is located between said first and second edge surfaces of said second main plate portion, and that has a shape complementing with that of said limiting indented portion to abut against said limiting indented portion; and an outer wall unit including a plurality of wall panels assembled to said structural frame and cooperating with said structural frame to form an accommodating space, wherein said limiting indented portion has two triangular inclined surfaces extending inclinedly, inwardly and respectively from said first edge surfaces of said first main plate portions toward each other so as to connect with each other.

2. The cabinet as claimed in claim 1, wherein said first connector further includes two protruding bars respectively protruding from said inner surfaces of said first main plate portions and respectively adjacent to said first edge surfaces of said first main plate portions, said second connector further including two limiting grooves cooperatively defined by said seat body and said second main plate portion and respectively engaging said protruding bars.

3. The cabinet as claimed in claim 1, wherein said first connector further includes a first block body connected to said junction of said second edge surfaces of said first main plate portions and protruding into said assembling space, said first fastening hole of said first connector extending through said first block body and said junction of said second edge surfaces of said first main plate portions, said limiting indented portion being formed on a side of said first block body below said first fastening hole of said first connector and extending toward said junction of said second edge surfaces of said first main plate portions, said seat body further having a receiving portion complementing with and receiving said first block body.

4. The cabinet as claimed in claim 3, wherein said first connector further includes a second block body connected to said junction of said second edge surfaces of said first main plate portions and spaced apart from said first block body, said seat body further having an end surface abutting against said second block body, and an engaging portion located between said end surface and said receiving portion and engaged between said first block body and said second block body.

5. The cabinet as claimed in claim 4, wherein said second block body has a second fastening hole extending therethrough, said seat body further having a second fastening hole extending inwardly from said end surface and corresponding in position to said second fastening hole of said second block body, said second fastening holes of said second block body and said seat body being configured to cooperatively receive and engage an eye bolt.

6. The cabinet as claimed in claim 1, wherein each of said connecting rods includes two inner plate bodies and an outer plate body connected to one another such that said connecting rod has a triangular columnar shape, said inner plate bodies being perpendicularly connected to each other and facing said accommodating space, said outer plate body being located outside of said accommodating space and having an outer surface formed with at least one liquid guide groove extending from one of said connecting end portions to the other one of said connecting end portions.

7. The cabinet as claimed in claim 6, wherein said liquid guide grooves of said connecting rods that are connected to the same one of said connector modules communicate with one another.

8. The cabinet as claimed in claim 6, wherein said outer surface of said outer plate body of each of said connecting rods is formed with two said liquid guide grooves that are symmetrical to each other.

9. A connector module configured for connecting three connecting rods such that the connecting rods are perpendicular to one another, said connector module comprising:
a first connector including
two first main plate portions perpendicularly connected to each other, each of said first main plate portions having an inner surface, an outer surface opposite to said inner surface, a first edge surface between first edges of said inner and outer surfaces, and a second edge surface between second edges of said inner and outer surfaces and perpendicularly connected to said first edge surface, said inner surfaces of said first main plate portions cooperatively defining an assembling space therebetween,
two connecting plate portions each of which is formed on said outer surface of a respective one of said first main plate portions for connection with one of the connecting rods,
a first fastening hole extending through a junction of said second edge surfaces of said first main plate portions, and
a limiting indented portion located on said junction of said second edge surfaces of said first main plate portions and adjacent to said first edge surfaces of said first main plate portions;
a second connector detachably connected to said first connector and including
a second main plate portion perpendicular to said first main plate portions and abutting against said first edge surfaces of said first main plate portions, said second main plate portion having a first edge surface and a second edge surface perpendicularly connected to each other and respectively corresponding to said first edge surfaces of said first main plate portion,
a seat body that is connected to a side of said second main plate portion, that is received in said assembling space, and that abuts against said first main plate portions, said seat body having a first fastening hole extending therethrough and corresponding in position to said first fastening hole of said first connector, said first fastening holes of said seat body and said first connector being configured to cooperatively receive and engage a fastening member to fasten together said first and second connectors, and
a connecting plate portion formed on another side of said second main plate portion opposite to said seat body for connection with one of the connecting rods, and
a limiting protruding portion that protrudes from said second main plate portion, that is adjacent to said first and second edge surfaces of said second main plate portion, and that has a shape complementing with that of said limiting indented portion to abut against said limiting indented portion,
wherein said limiting indented portion has two triangular inclined surfaces extending inclinedly, inwardly and respectively from said first edge surfaces of said first main plate portions toward each other so as to connect with each other.

10. The connector module as claimed in claim 9, wherein said first connector further includes two protruding bars respectively protruding from said inner surfaces of said first main plate portions and respectively adjacent to said first edge surfaces of said first main plate portions, said second connector further including two limiting grooves cooperatively defined by said seat body and said second main plate portion and respectively engaging said protruding bars.

11. The connector module as claimed in claim 9, wherein said first connector further includes a first block body connected to said junction of said second edge surfaces of said first main plate portions and protruding into said assembling space, said first fastening hole of said first connector extending through said first block body and said junction of said second edge surfaces of said first main plate portions, said limiting indented portion being formed on a side of said first block body below said first fastening hole of said first connector and extending toward said junction of said second edge surfaces of said first main plate portions, said seat body further having a receiving portion complementing with and receiving said first block body.

12. The connector module as claimed in claim 11, wherein said first connector further includes a second block body connected to said junction of said second edge surfaces of said first main plate portions and spaced apart from said first block body, said seat body further having an end surface abutting against said second block body, and an engaging portion located between said end surface and said receiving portion and engaged between said first block body and said second block body.

13. The connector module as claimed in claim 12, wherein said second block body has a second fastening hole extending therethrough, said seat body further having a second fastening hole extending inwardly from said end surface and corresponding in position to said second fastening hole of said second block body, said second fastening holes of said second block body and said seat body being configured to cooperatively receive and engage an eye bolt.

\* \* \* \* \*